(12) United States Patent
Mignot et al.

(10) Patent No.: US 12,207,477 B2
(45) Date of Patent: Jan. 21, 2025

(54) SAME LEVEL MRAM STACKS HAVING DIFFERENT CONFIGURATIONS

(71) Applicant: International Business Machines Corporation, Armonk, NY (US)

(72) Inventors: Yann Mignot, Slingerlands, NY (US); Oscar van der Straten, Guilderland Center, NY (US); Dimitri Houssameddine, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 17/205,190

(22) Filed: Mar. 18, 2021

(65) Prior Publication Data

US 2022/0302207 A1    Sep. 22, 2022

(51) Int. Cl.
*H10B 61/00* (2023.01)
*H10N 50/01* (2023.01)
*H10N 50/80* (2023.01)
*H10N 50/85* (2023.01)

(52) U.S. Cl.
CPC ............ *H10B 61/20* (2023.02); *H10N 50/01* (2023.02); *H10N 50/80* (2023.02); *H10N 50/85* (2023.02)

(58) Field of Classification Search
CPC ....... H01L 27/226; H01L 43/02; H01L 43/10; H01L 43/12; H01L 27/222; H01L 43/08; G11C 11/161; H10B 61/20; H10B 61/00; H10N 50/01; H10N 50/80; H10N 50/85; H10N 50/10
See application file for complete search history.

(56) References Cited

U.S. PATENT DOCUMENTS

| | | | |
|---|---|---|---|
| 6,785,159 B2 | 8/2004 | Tuttle | |
| 9,047,964 B2 | 6/2015 | Lee et al. | |
| 9,218,866 B2 | 12/2015 | Ranjan et al. | |
| 10,388,859 B2 | 8/2019 | Kim et al. | |
| 10,707,413 B1 | 7/2020 | Dutta | |
| 10,784,440 B2 | 9/2020 | Tseng et al. | |
| 2010/0022030 A1 | 1/2010 | Ditizio | |
| 2011/0121417 A1 | 5/2011 | Li et al. | |
| 2012/0134200 A1 | 5/2012 | Khoueir et al. | |
| 2013/0119494 A1 | 5/2013 | Li et al. | |
| 2016/0133828 A1 | 5/2016 | Lu et al. | |
| 2019/0066746 A1* | 2/2019 | Li | G11C 11/161 |
| 2019/0148625 A1* | 5/2019 | Tseng | A61K 8/731 365/158 |
| 2019/0206929 A1* | 7/2019 | Pinarbasi | H10B 10/00 |
| 2020/0176511 A1* | 6/2020 | Park | H01F 10/32 |

(Continued)

OTHER PUBLICATIONS

International Search Report and Written Opinion for Application PCT/EP2022/055765, Jul. 28, 2022, 11 pages.

(Continued)

*Primary Examiner* — Fernando L Toledo
*Assistant Examiner* — Jahae Kim
(74) *Attorney, Agent, or Firm* — Jeffrey M. Ingalls

(57) ABSTRACT

A semiconductor device is provided. The semiconductor device includes a base layer, a first MRAM device formed on the base layer, and a second MRAM device formed on the base layer. The first MRAM device has a different performance characteristic than the second MRAM device.

12 Claims, 13 Drawing Sheets

(56) References Cited

U.S. PATENT DOCUMENTS

2022/0045268 A1\* 2/2022 Xia .................. H10N 50/85

OTHER PUBLICATIONS

Li et al., "Voltage-controlled magnetoelectric memory and logic devices," MRS Bulletin, Dec. 1, 2018, pp. 970-977, vol. 43 No. 12.
Park et al., "A novel integration of STT-MRAM for on-chip hybrid memory by utilizing non-volatility modulation," 2019 IEEE International Electron Devices Meeting (IEDM), San Francisco, CA, USA, 2019, pp. 2.5.1-2.5.4, doi: 10.1109/IEDM19573.2019.8993614.
Gallagher et al., "22nm STT-MRAM for Reflow and Automotive Uses with High Yield, Reliability, and Magnetic Immunity and with Performance and Shielding Options," 2019 IEEE International Electron Devices Meeting (IEDM), San Francisco, CA, USA, 2019, pp. 2.7.1-2.7.4, doi: 10.1109/IEDM19573.2019.8993469.

\* cited by examiner

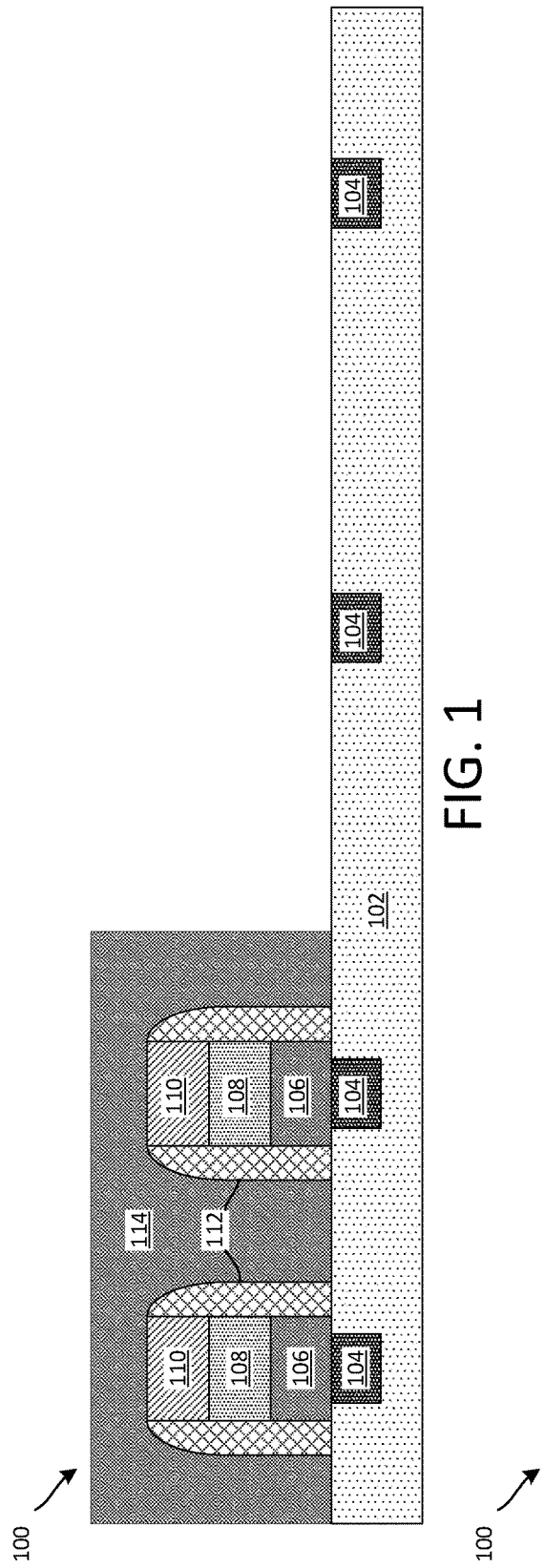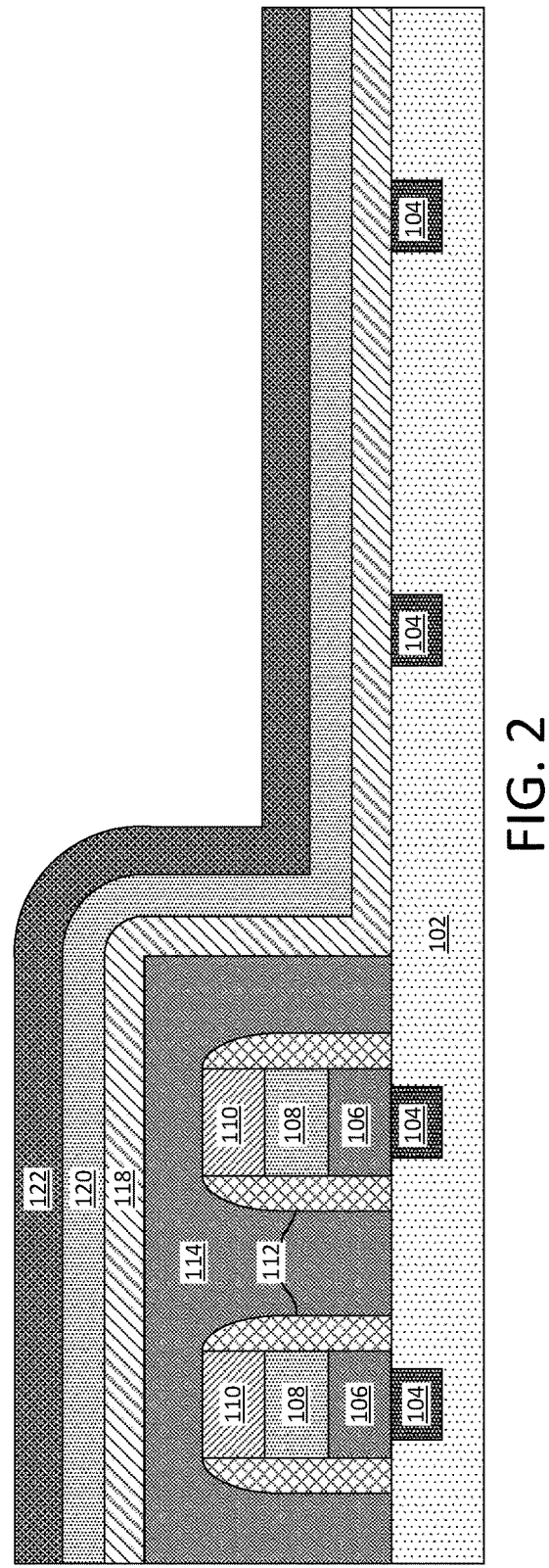

SAME LEVEL MRAM STACKS HAVING DIFFERENT CONFIGURATIONS

BACKGROUND

The present disclosure relates to the electrical, electronic and computer fields. In particular, the present disclosure relates to magnetoresistive random-access memory ("MRAM") device cells having different configurations.

Certain MRAM devices may be fabricated to include a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Certain MRAM devices may be embedded MRAM (eMRAM) at the 28 or 22 nm level. There may be a need to offer both types of MRAM (e.g., embedded storage and cache) on the same chip, and this combination of different types of MRAM may provide benefits in terms of system performance.

SUMMARY

Embodiments of the present disclosure relate to a semiconductor device. The semiconductor device includes a base layer, a first MRAM device formed on the base layer, and a second MRAM device formed on the base layer. The first MRAM device has a different performance characteristic than the second MRAM device.

Certain embodiments of the present disclosure relate to a method of manufacturing a semiconductor device. The method includes forming a base layer, forming a first MRAM device on the base layer, and forming a second MRAM device on the base layer. The first MRAM device has a different performance characteristic than the second MRAM device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 1 is cross-sectional side view of a semiconductor device including MRAM devices at an intermediated stage of the manufacturing process, according to embodiments.

FIG. 2 is cross-sectional side view of the semiconductor device of FIG. 1 after additional fabrication operations, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes MRAM devices including magnetic tunnel junction ("MTJ") stacks and methods of manufacturing MRAM devices. In particular, the present disclosure describes MRAM devices which include different types of MRAM devices (e.g., embedded memory (e.g., a persistent memory device) and cache) on the same level (e.g., formed on the same level on a BEOL base layer). Each of the different types of MRAM devices may have different critical dimensions (CDs), different overall heights, different thicknesses to the component layers of the MRAM device, and/or different material compositions of one or more of the MRAM device layers.

In general, the storage bits may have larger CDs (60-80 nm) and a high retention stack (high coercive field (high-Hc), high bias field (high-Eb), but also high switching current (Ic)). Such devices may provide high retention and field immunity, but may have slow programming (>100 ns) and require a large amount of current. Also, the cache bits may have smaller CDs (30-50 nm) and a stack optimized for high-speed switching. Hc, Eb would be much lower but the programming speed would be 10-50× faster. In terms of stack differences, the overall stack structure for storage bits and cache bits may be very similar, but the structural and compositional details may be quite different (e.g., the thickness of the tunnel barrier layer and the composition of the free layer).

According to certain of the present embodiments, by forming the different types of MRAM devices (e.g., cache and storage) at the same level, manufacturing costs may be reduced, and the manufacturing process may be simplified.

For example, with related MRAM devices being formed at different levels, it may be possible to have the cache bits and storage bits formed in two different metal levels, but then additional interlayer dielectric (ILD) deposition, planarization, and etching steps may be required (as well as additional mask counts).

In general, one advantage of using MRAM devices over other non-volatile memory (NVM) technologies such as Flash is the small number of additional masks required (e.g., only 3-5). In this regard, doubling the number of masks needed (i.e., to form the different MRAM types on different levels) would hurt the value proposition for MRAM devices.

Figure 15:
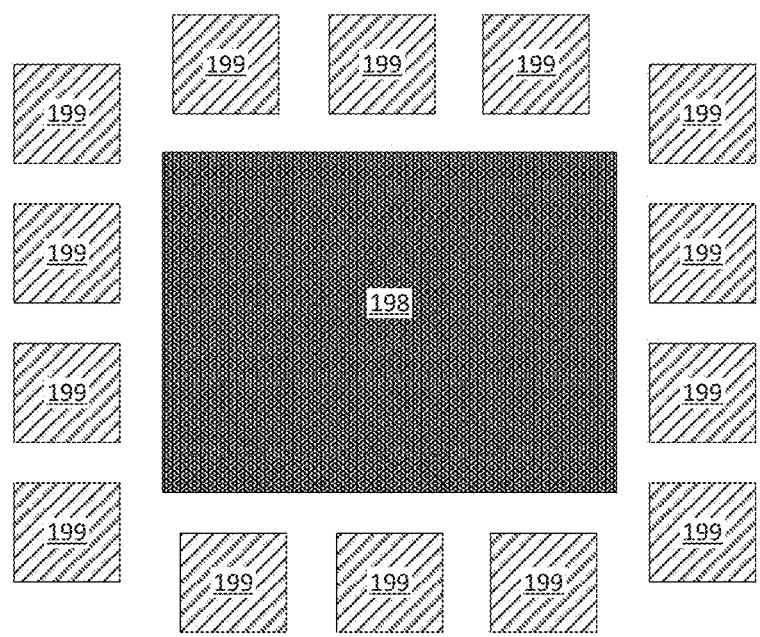
FIG. 15 is top-down schematic view of the semiconductor device of FIG. 1 showing cache arrays surrounded by storage bits, according to embodiments.

In the present embodiments, cache type MRAM devices may be embedded in the storage area (or the opposite) to reduce the interconnect length and improve the response time. In an example layout shown in FIG. 15, the cache arrays 198 would be surrounded by storage bits 199. In general, storage bits have a larger CD which usually gives a very large process window as compared to cache bits having relatively small CDs. Thus, in the present embodiment, this layout may improve the array uniformity for the cache bits, and therefore improve the process window. Therefore, as indicated above, the present embodiments may realize improvements in the manufacturing process efficiency (i.e., less semiconductor processing steps and less masks), and may realize cost savings related to same.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory (MRAM) devices using magnetic tunnel junctions (MTJ) are one option to replace existing eDRAM technologies. MRAM is a non-volatile memory, which is a type of computer memory that can retrieve stored information even after power has been cycled. This benefit of being able to store information even when power is cycled is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating barrier (e.g., aluminum oxide) to form a stacked structure. One of the ferromagnetic layers has a magnetization that is fixed, and it is therefore referred to as a fixed layer or pinned layer or reference layer. However, the other ferromagnetic layer has a magnetization that can change, and it is therefore referred to as a free layer. When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillared structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

As discussed above, MRAM devices may be useful for a variety of different applications, such as embedded storage and cache. The embodiments described herein provide MRAM devices and method of manufacturing MRAM devices, where a plurality of different types/configurations may be present on a same level of a chip.

Referring now to the drawings in which like numerals represent the same or similar elements and initially to FIG. 1, a cross-sectional view depicting certain semiconductor device 100 at an intermediate stage of the manufacturing process is shown, according to embodiments. In FIG. 1, a base layer 102 is provided. The base layer 102 may include certain electrical interconnections, wiring lines, or other devices. For example, the base layer 102 may include front-end-of-line (FEOL) elements (e.g., transistors, circuit elements, resistors, capacitors, etc.) or middle-of-line (MOL) elements (e.g., electrical connections between transistors, gate contact formation structures, etc.). It should be appreciated that the base layer 102 may include any suitable number of different components and may include a plurality of sub-layers with different components. In general, the base layer 102 is any suitable layer that can function as a starting structure upon which the embedded MRAM device can be formed.

Figure 14:
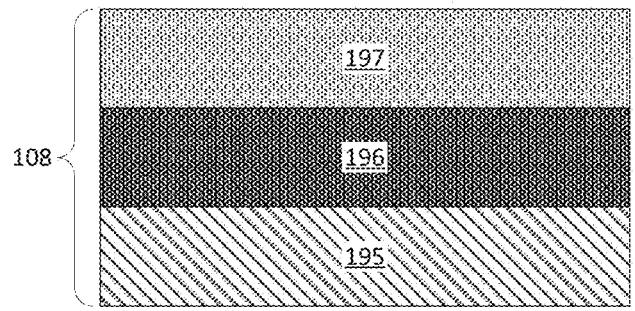
FIG. 14 is cross-sectional side view of the MRAM stack of the semiconductor device of FIG. 1, according to embodiments.

As shown in FIG. 1, an MRAM pillar includes a bottom electrode 106, an MRAM stack 108 and a top electrode 110. Bottom contacts 104 are formed in contact with the base layer 102. For the MRAM pillar, a bottom electrode 106 is formed on the bottom contact 104 (and portions of the base layer 102). Then, as shown in FIG. 1, an MRAM stack 108 is formed on the bottom electrode 106. In certain embodiments, as shown in FIG. 14, the MRAM stack 108 may include a reference layer 195, a tunnel barrier layer 196, a magnetic free layer 197. The tunnel barrier layer 196 may be formed on the reference layer 195. Following the formation of the tunnel barrier layer 196, the magnetic free layer 197 is formed on the tunnel barrier layer 196. Next, the top electrode 110 is formed on the magnetic free layer 197 of the MRAM stack 108. It should be appreciated that this MRAM stack 108 structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

As shown in FIG. 1, patterning has been performed on the MRAM stack structure (i.e., the bottom electrode 106, the MRAM stack 108 and the top electrode 110) to form an MRAM device pillar. As is understood by one of ordinary skill in the art, the MRAM device pillar may be formed by any suitable patterning and etching technique (e.g., ion-beam etching). In certain embodiments, a dielectric liner layer 112 is formed to encapsulate the MRAM device pillar. The dielectric liner layer 112 may be comprised of a SiN material or any other suitable dielectric materials. As shown in FIG. 1, the dielectric liner layer 112 covers at least portions of the sidewall surfaces of the bottom electrode 106, the MRAM stack 108 and the top electrode 110. Although not shown in FIG. 1, the dielectric liner layer 112 may initially be formed to conformally cover the entire surface of the wafer, followed by the optional formation of a portion of a second interlayer dielectric layer (not shown), followed by the removal of upper portions of the dielectric liner layer 112 and the second interlayer dielectric layer by a CMP process to expose the upper surface of the top electrode 110. It should be appreciated that the semiconductor device 100 may not include the second interlayer dielectric layer, or it may include other suitable layers. One function of the dielectric liner layer 112 may be to protect the MRAM stack 108 from oxidation. Following the formation of the dielectric liner layer 112, an oxide layer 114 is provided to protect and/or cover the semiconductor device 100. Initially, the oxide layer 114 may be provided across the entire surface of the base layer 102, and then a cut mask may be used to remove the portions of the oxide layer 114 that are not proximate to the two different MRAM stacks 108. It should be appreciated that in the example shown in FIG. 1, there are two different MRAM stacks 108 of the same first type next to either. However, it should be appreciated that there may be any other suitable number of MRAM stacks 108 as appropriate for a given application or device. In one example, the two MRAM stacks 108 may be spaced approximately 200 nm to about 1 µm apart. In other examples, the spacing between adjacent MRAM stacks 108 may be about 10× the overall height of the MRAM pillars.

Referring now to FIG. 2, this figure is a cross-sectional view of the semiconductor device 100 of FIG. 1 after subsequent manufacturing processes, according to embodiments. As shown in FIG. 2, this is the point in the manufacturing process where another MRAM pillar is added that has a different configuration than the two MRAM pillars shown in FIG. 1, and this additional MRAM pillar is formed at the same level (i.e., on the same base layer 102) as the ones described above with respect to FIG. 1. A second bottom electrode 118 is formed over the contact 104, a second MRAM stack 120, and a second top electrode 122 are conformally deposited over the entire surface of the semiconductor device 100. Thus, at least initially, the layers forming the second MRAM pillar (i.e., the second bottom electrode 118, the second MRAM stack 120, and the second top electrode 122) are formed over the tops of the MRAM stacks 108.

Figure 3:
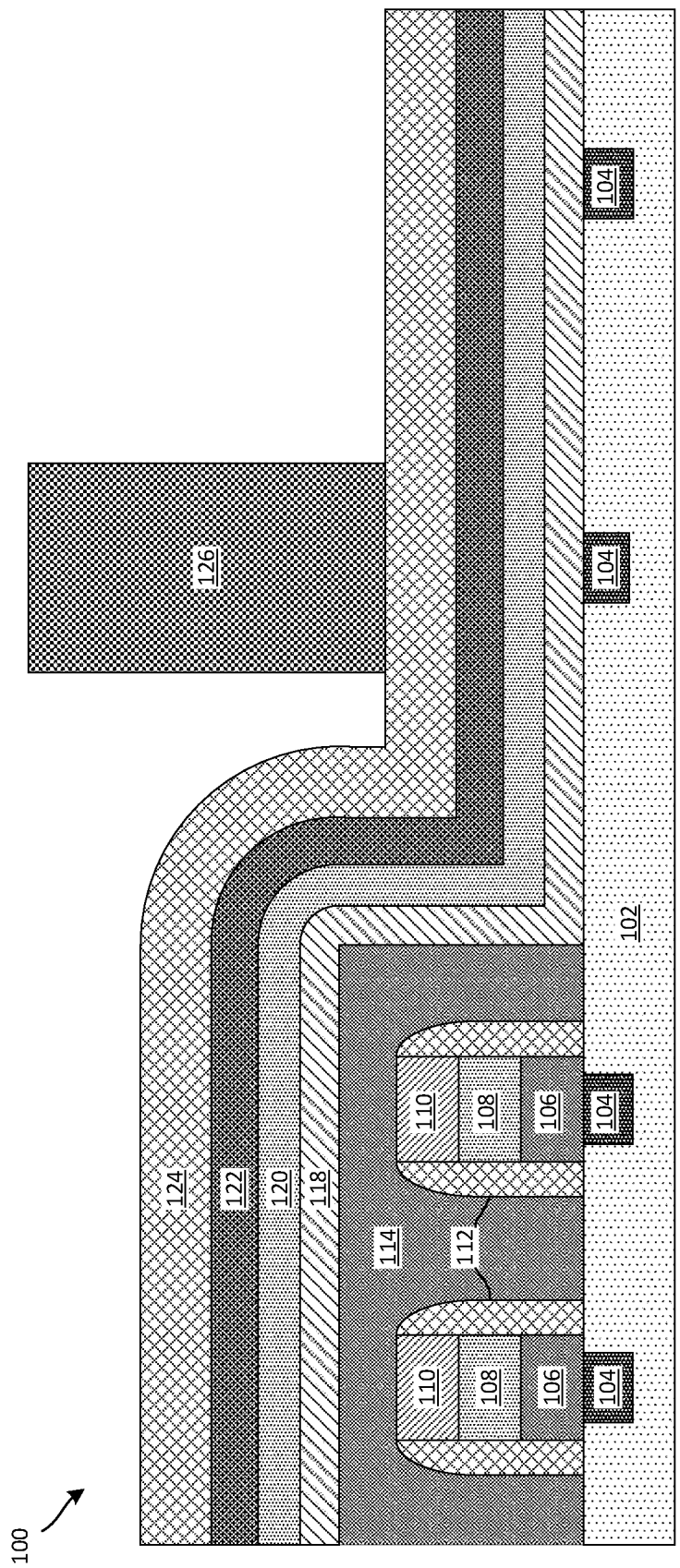
FIG. 3 is cross-sectional side view of the semiconductor device of FIG. 2 after additional fabrication operations, according to embodiments.

Referring now to FIG. 3, this figure is a cross-sectional view of the semiconductor device 100 of FIG. 2 after subsequent manufacturing processes, according to embodiments. As shown in FIG. 3, an oxide layer 124 is formed on the second top electrode 122, and a mask 126 is formed on the oxide layer 124 in an area where the second MRAM pillar will be formed.

Figure 4:
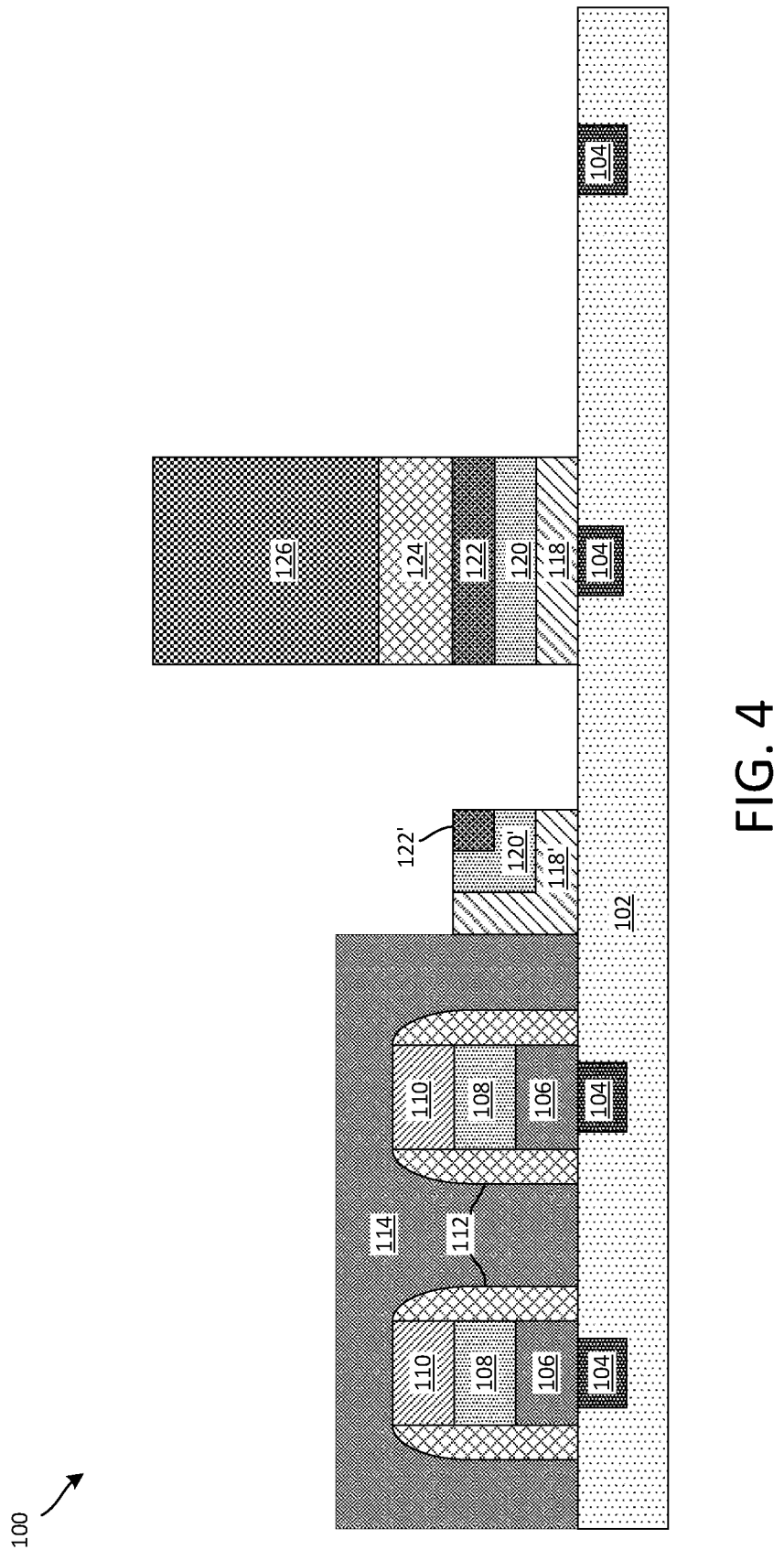
FIG. 4 is cross-sectional side view of the semiconductor device of FIG. 3 after additional fabrication operations, according to embodiments.

Referring now to FIG. 4, this figure is a cross-sectional view of the semiconductor device 100 of FIG. 3 after subsequent manufacturing processes, according to embodiments. As shown in FIG. 4, an etching process is performed using the mask 126 to pattern the second MRAM pillar (the second bottom electrode 118, the second MRAM stack 120, and the second top electrode 122). However, in certain examples, as shown in FIG. 4, there may be some residual portions of the stack (i.e., the residual portion of the second bottom electrode 118', the residual portion of the second MRAM stack 120', and the residual portion of the second top electrode 122') left after the etching operation due the height of the stack in this particular region. In other words, where there is a step down from the region near edge of the MRAM stacks 108, the height of the previously deposited layers (the second bottom electrode 118, the second MRAM stack 120, and the second top electrode 122) is, for example 2× or 3× thicker than in other areas. In theory, if an etching material would have a perfect (or near perfect) selectivity to the base layer 102 and bottom contact 104 relative to the second bottom electrode 118, the second MRAM stack 120, and the second top electrode 122 layer, it may be possible to eliminate the residual portions without excessively etching into the base layer 102.

Figure 5:
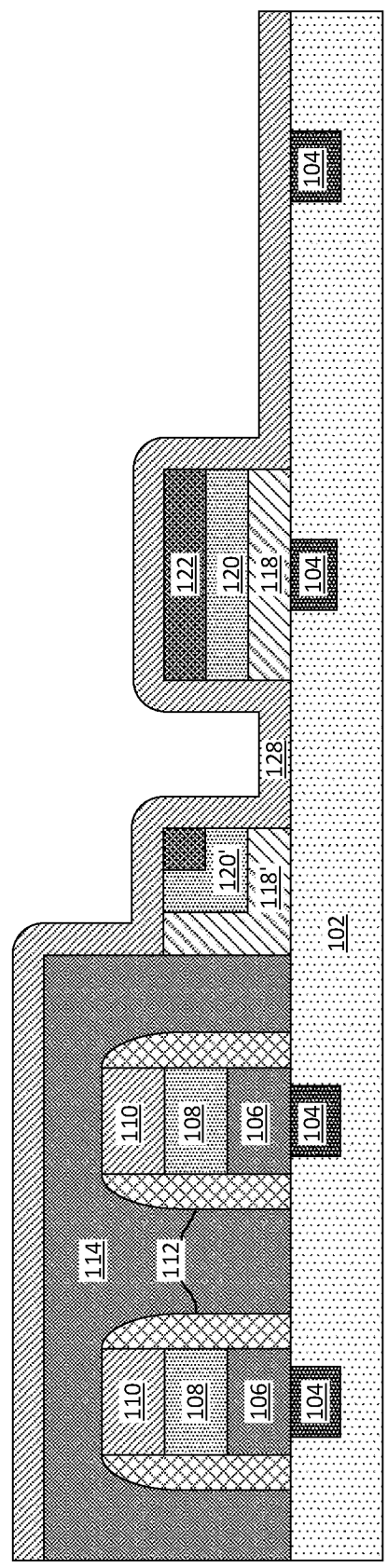
FIG. 5 is cross-sectional side view of the semiconductor device of FIG. 4 after additional fabrication operations, according to embodiments.

Referring now to FIG. 5, this figure is a cross-sectional view of the semiconductor device 100 of FIG. 4 after subsequent manufacturing processes, according to embodiments. As shown in FIG. 5, a second dielectric liner layer 128 is formed over the entire semiconductor device 100 to cover the second MRAM stack 120. This second dielectric liner layer 128 (or second spacer layer) may be comprised of a SiN material, and may be the same material or different from the dielectric liner layer 112.

Figure 6:
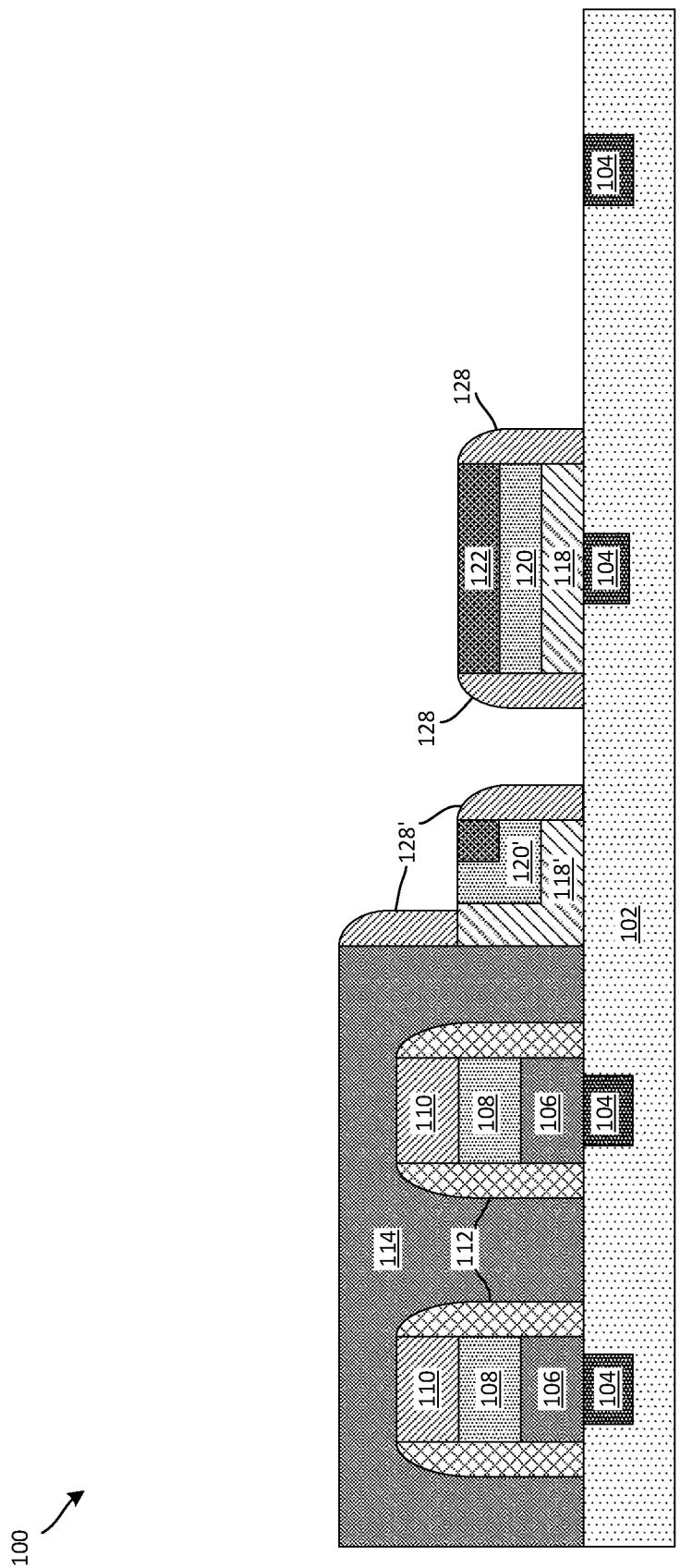
FIG. 6 is cross-sectional side view of the semiconductor device of FIG. 5 after additional fabrication operations, according to embodiments.

Referring now to FIG. 6, this figure is a cross-sectional view of the semiconductor device 100 of FIG. 5 after subsequent manufacturing processes, according to embodiments. As shown in FIG. 6, an etching process is performed to remove unwanted portions of the second dielectric liner layer 128. As shown in FIG. 6, the remaining portions of the second dielectric liner layer 128 exist on the sidewalls of the second MRAM pillar. It should be appreciated that in certain examples, residual portions of the second dielectric liner layer 128' may also still remain next to the residual portion of the second bottom electrode 118', the residual portion of the second MRAM stack 120', and the residual portion of the second top electrode 122'.

Figure 7:
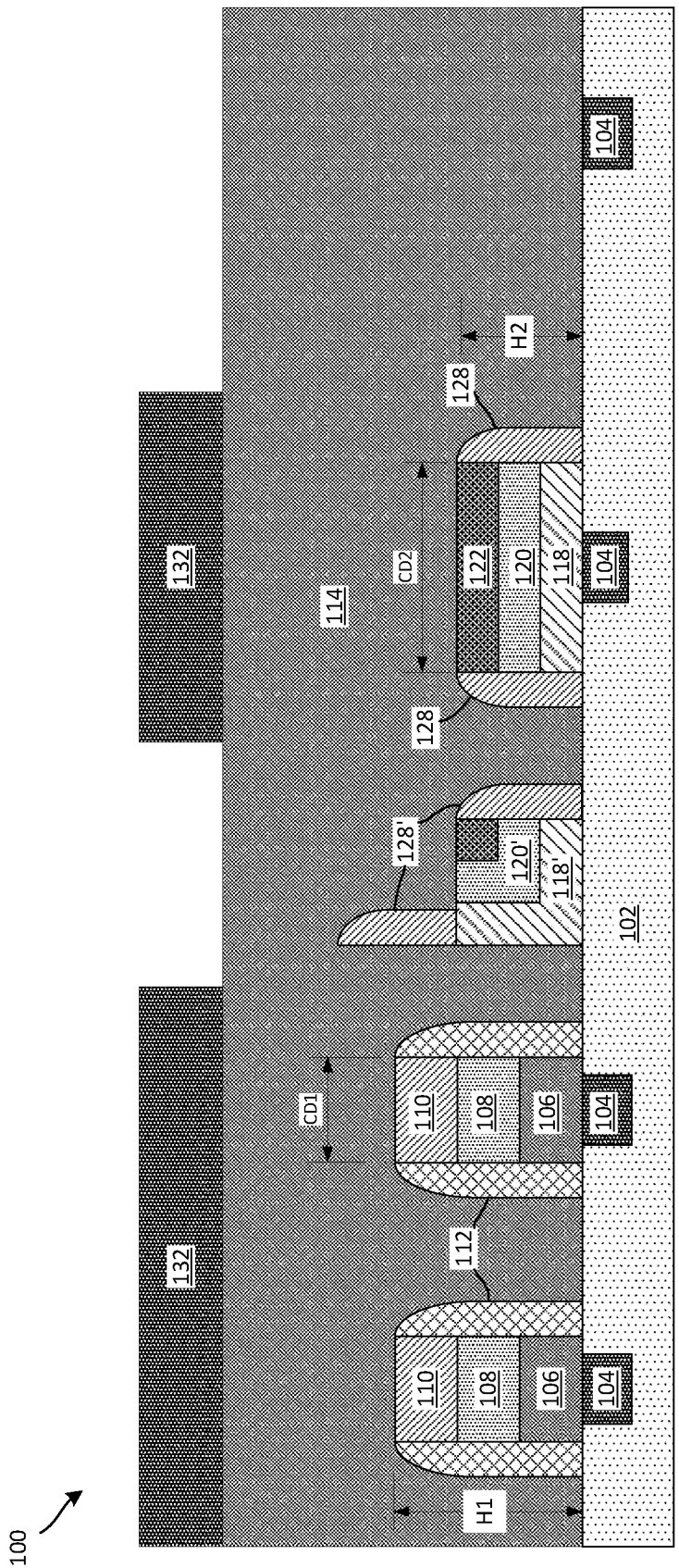
FIG. 7 is cross-sectional side view of the semiconductor device of FIG. 6 after additional fabrication operations, according to embodiments.

Referring now to FIG. 7, this figure is a cross-sectional view of the semiconductor device 100 of FIG. 6 after subsequent manufacturing processes, according to embodiments. At this stage in the manufacturing process, it can be seen that the overall height of the first MRAM pillar H1 is different than the overall height of the second MRAM pillar H2. Also, the critical dimension (CD) (e.g., the diameter is the pillars are cylindrical) of the first MRAM pillar CD1 is different than the CD of the second MRAM pillar CD2. Thus, as mentioned above, certain of the MRAM devices may have structural characteristics that are suitable for one type of application (e.g., storage) and other of the MRAM devices may have structural characteristics that are suitable for a second type of application (e.g., cache). It should be appreciated that the material composition of the bottom electrode 106 may be the same or different than the material composition of the second bottom electrode 118, the material composition of the MRAM stack 108 may be the same or different than the material composition of the second MRAM stack 120, and the material composition of the top electrode 110 may be the same or different than the material composition of the second top electrode 122. It should also be appreciated that the heights (or thicknesses) of the corresponding layers (e.g., bottom electrode 106 and second bottom electrode 118) may be different between the first and second MRAM pillars. In a broader sense, it may be sufficient to understand that first and second MRAM devices (or pillars) have a different performance characteristic than each other (i.e., due to one or more of the different physical or chemical properties discussed above).

As also shown in FIG. 7, additional material of the oxide layer 114 is added to fill in the all the spaces between the MRAM devices, and the oxide layer 114 may function as a planarization layer. In certain examples, the oxide layer 114 may be subjected to CMP or some other planarization process. As shown in FIG. 7, a second mask 132 is formed on the oxide layer 114. In particular, the second mask 132 is formed in areas excluding the residual portions (i.e., the residual portions of the second dielectric liner layer 128', the residual portion of the second bottom electrode 118', the residual portion of the second MRAM stack 120', and the residual portion of the second top electrode 122') so that they may be removed in a subsequent etching operation.

Figure 8:
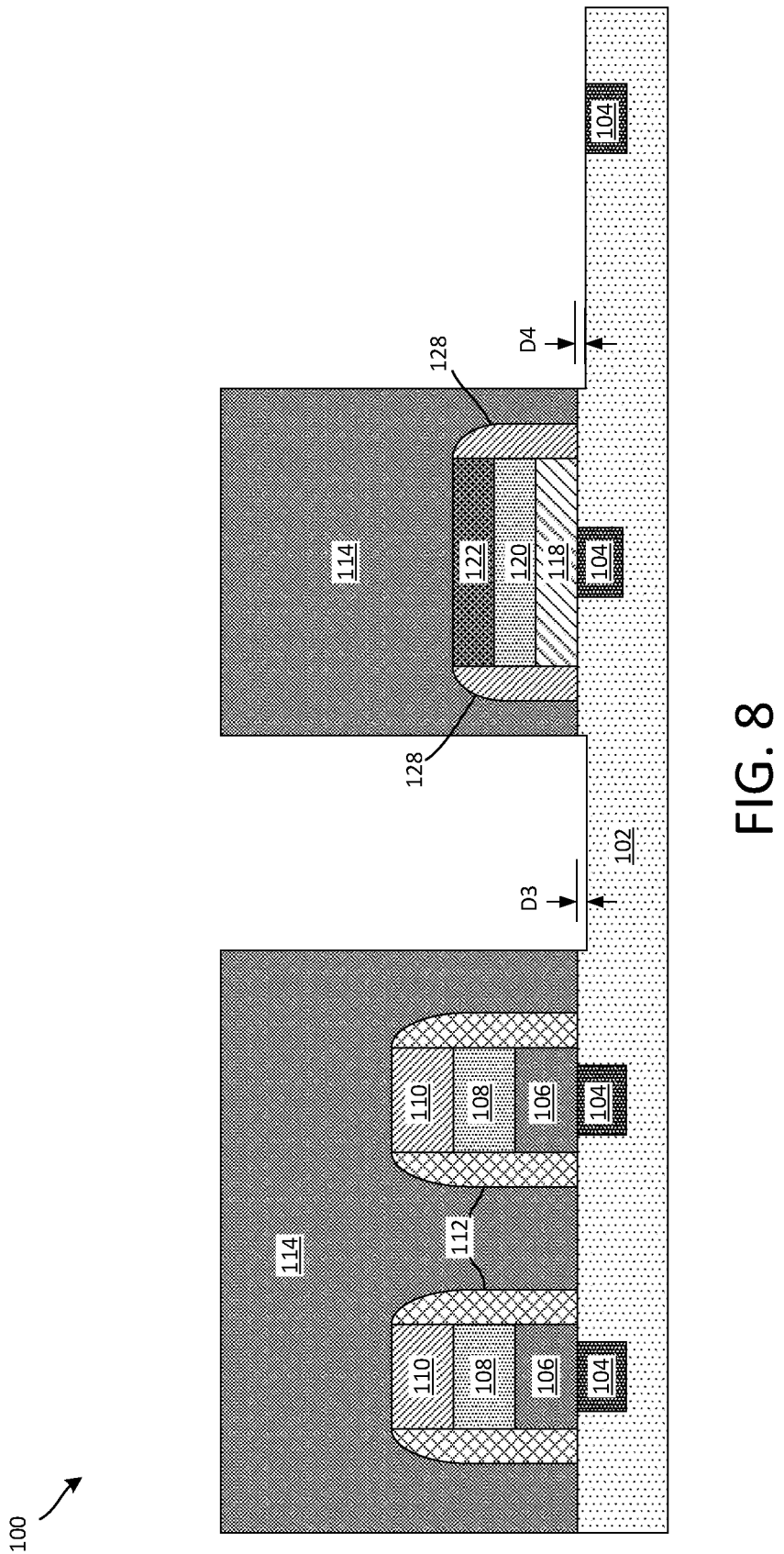
FIG. 8 is cross-sectional side view of the semiconductor device of FIG. 7 after additional fabrication operations, according to embodiments.

Referring now to FIG. 8, this figure is a cross-sectional view of the semiconductor device 100 of FIG. 7 after subsequent manufacturing processes, according to embodiments. As shown in FIG. 8, an etching process has been performed to remove the residual portions of the second dielectric liner layer 128', the residual portion of the second bottom electrode 118', the residual portion of the second MRAM stack 120', and the residual portion of the second top electrode 122'. Then, the second mask 132 is removed. It should be appreciated that in certain examples, due to an imperfect etching selectivity between the base layer 102 and the bottom contact 104 (in the case where additional MRAM devices are to be formed) and the residual portions, there may be a certain amount of a recess (i.e., at a depth D3 as shown in FIG. 8, and a depth D4 for the bottom contact 104 in the case where an additional MRAM device is to be formed) into the base layer 102 during these etching operations.

Figure 9:
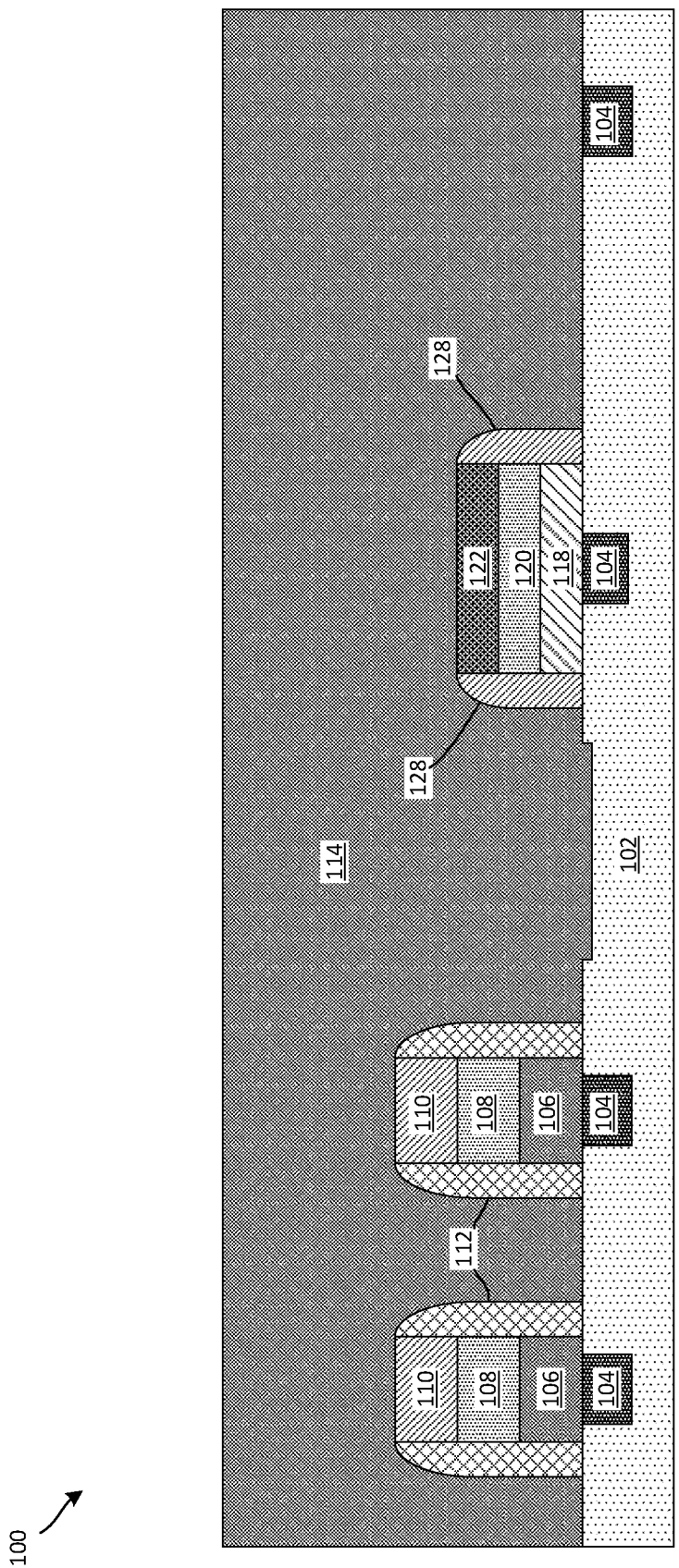
FIG. 9 is cross-sectional side view of the semiconductor device of FIG. 8 after additional fabrication operations, according to embodiments.

Referring now to FIG. 9, this figure is a cross-sectional view of the semiconductor device 100 of FIG. 8 after subsequent manufacturing processes, according to embodiments. As shown in FIG. 9, additional material of the oxide layer 114 is added to fill in the all the spaces between the MRAM devices, and the oxide layer 114 may again function as a planarization layer. In certain examples, the oxide layer 114 may be subjected to CMP or some other planarization process.

Figure 10:
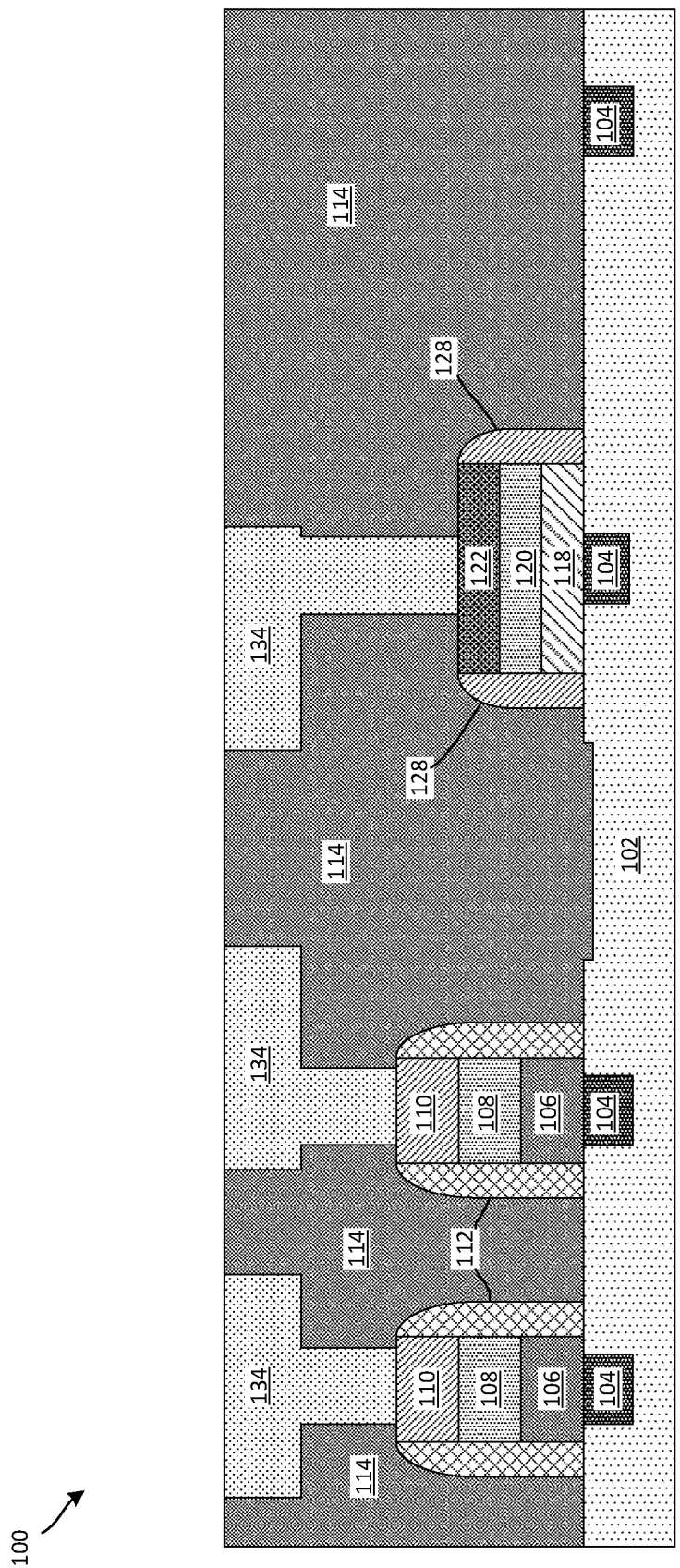
FIG. 10 is cross-sectional side view of the semiconductor device of FIG. 9 after additional fabrication operations, according to embodiments.

Referring now to FIG. 10, this figure is a cross-sectional view of the semiconductor device 100 of FIG. 9 after subsequent manufacturing processes, according to embodiments. As shown in FIG. 10, metallization layer 134 is formed to make electrical contact with the first and second MRAM devices. It should be appreciated that the metallization layer 134 shown in FIG. 10 is merely one example, and any other suitable configuration may be used.

Figure 11:
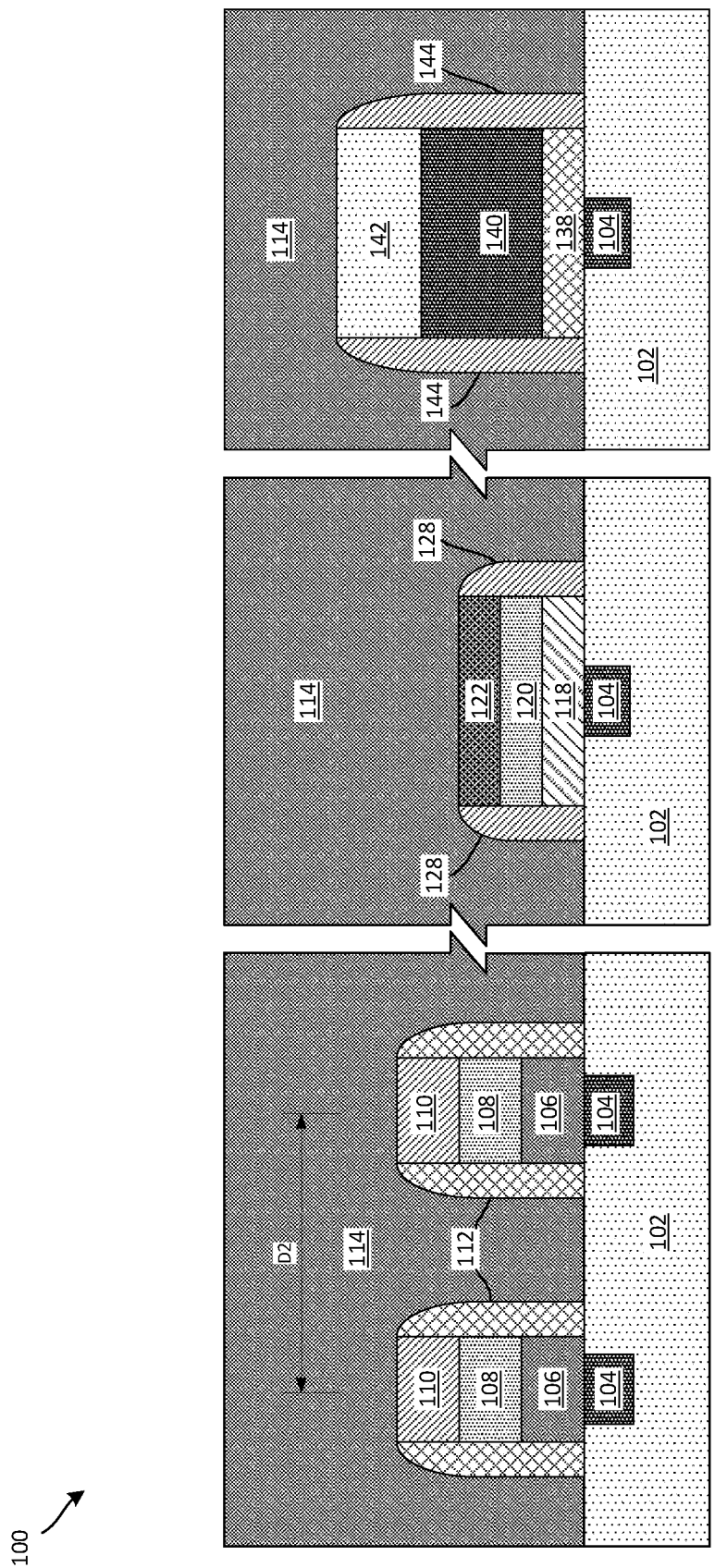
FIG. 11 is cross-sectional side view of the semiconductor device of FIG. 10 after additional fabrication operations, according to embodiments.

Referring now to FIG. 11, this figure is a cross-sectional view of the semiconductor device 100 of FIG. 10 after subsequent manufacturing processes, according to embodiments. As shown in FIG. 11, a third MRAM pillar may be formed in a manner similar to the process described above for the second MRAM pillar. The third MRAM pillar may include a third contact 104, a third bottom electrode 138, a third MRAM stack 140, a third top electrode 142 and a third dielectric liner layer 144. The process of forming the third MRAM pillar is similar to the process for forming the second MRAM pillar, and it is not repeated here for the sake of brevity. It should be appreciated that the process of forming these different types of MRAM pillars on the base layer 102 and contacts 104 may be repeated any number of times to form as many types of MRAM pillars that are desired for a particular application.

Figure 12:
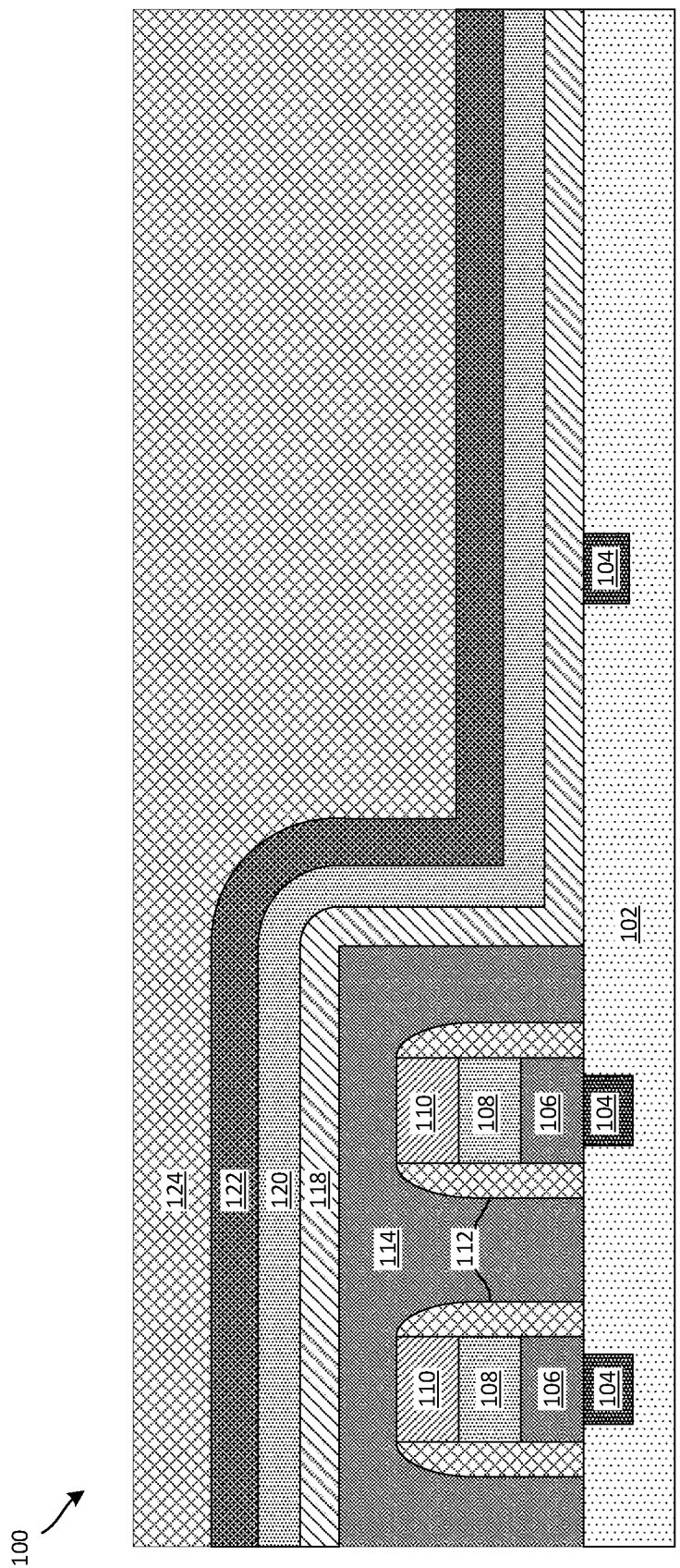
FIG. 12 is cross-sectional side view of the semiconductor device of FIG. 2 after additional fabrication operations and including a chemical vapor deposition oxide refill layer, according to embodiments.

Referring now to FIG. 12, this figure is cross-sectional side view of the semiconductor device of FIG. 2 after additional fabrication operations and including a chemical vapor deposition oxide refill layer, according to embodiments. As shown in FIG. 12, unlike the conformal deposition of the oxide layer 124 shown in FIG. 2 (i.e., which is more of a liner layer), here the oxide layer 124 is formed according to a CVD oxide refill process followed by a CMP process to planarize the surface. Other than this difference, the remainder of the processes are similar to the processes described above with respect to FIGS. 3-11 and are not repeated here for the sake of brevity.

Figure 13:
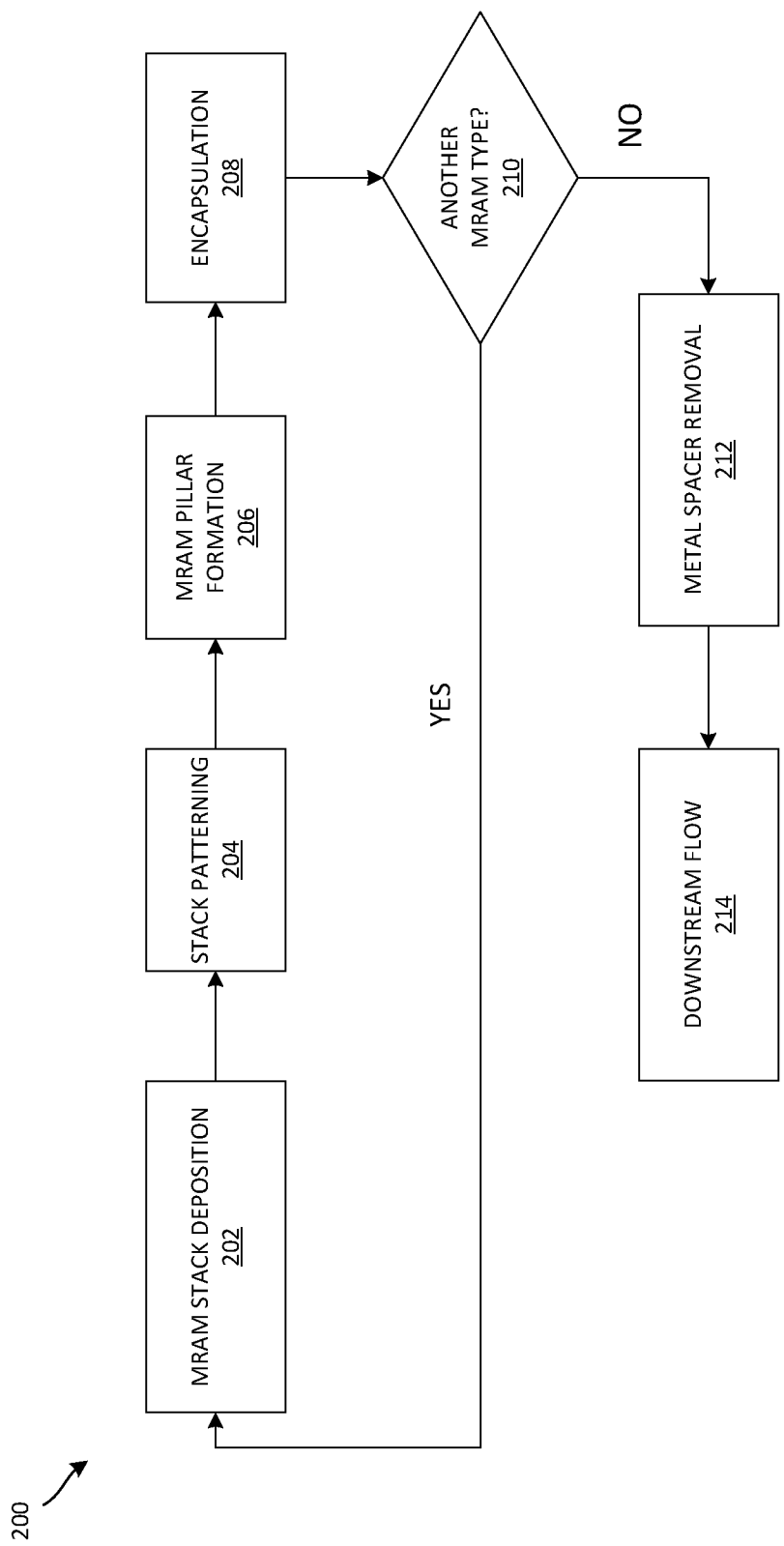
FIG. 13 is a flow chart representing depicting a method of manufacturing a plurality of different types of MRAM stacks at a same level, according to embodiments.

FIG. 13 is a flow chart representing depicting a method of manufacturing a plurality of different types of MRAM stacks at a same level, according to embodiments. As shown in FIG. 13, at operation 202 the MRAM stack deposition is performed. This operation is prior to the patterning of the first MRAM pillar shown in FIG. 1, and also corresponds to the formation of the second bottom electrode 118 layer, the second MRAM stack 120 layer, and the second top electrode 122 shown in FIG. 2. At operation 204, the patterning of the MRAM stack is performed, which corresponds to the process described above with respect to the FIG. 3. At operation 206, etching is performed to create the MRAM pillar formation, which corresponds to the process described above with respect to the FIG. 4. At operation 208, the encapsulation of the MRAM pillar is performed, which may correspond to the processed described above with respect to FIGS. 5-9. At operation 210, if another MRAM device type is to be formed (e.g., such as the third MRAM pillar shown in FIG. 10, the process returns back to operation 202. At operation 210, if another MRAM device type is not to be formed, the process continues to operation 212 for the metal spacer removal, and then to operation 214 for additional downstream flow processes as are known to a person of skill in the art.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a base layer selected from the group consisting of a back end of line (BBOL) layer, a middle of line (MOL) layer and a front end of line (FEOL) layer;
   a plurality of bottom contacts formed in the base layer,
   a first MRAM device that is a cache bit formed on the base layer in contact with one of the plurality of bottom contacts in a first area; and
   a plurality of second MRAM devices that are storage bit devices formed on the base layer in contact with one of the plurality of bottom contacts in a second area that surrounds the first area, the plurality of second MRAM devices being formed at a same level as the first MRAM device on the base layer, wherein the first MRAM device has a smaller critical dimension than the plurality of second MRAM devices, wherein the first MRAM device has a lower data retention characteristic and a lower switching current than the plurality of second MRAM devices, and wherein the plurality of second MRAM devices have a lower programming speed and a lower response time than the first MRAM device, and wherein a height of the first MRAM device is higher than a height of the plurality of second MRAM devices.

2. The semiconductor device of claim 1,
wherein the first MRAM device includes a first bottom electrode, a first MRAM stack, and a first top electrode, and wherein each of the plurality of second MRAM devices include a second bottom electrode, a second MRAM stack, and a second top electrode.

3. The semiconductor device of claim 2, wherein a thickness of the first bottom electrode is different than a thickness of the second bottom electrode.

4. The semiconductor device of claim 2, wherein a thickness of the first top electrode is different than a thickness of the second top electrode.

5. The semiconductor device of claim 2,
wherein the first MRAM device includes a spacer layer formed on sidewalls of the first bottom electrode, the first MRAM stack, and the first top electrode, and wherein each of the plurality of second MRAM devices includes a second spacer layer formed on sidewalls of the second bottom electrode, the second MRAM stack, and the second top electrode.

6. The semiconductor device of claim 1, wherein the first MRAM device and the plurality of second MRAM devices each include a fixed magnetization layer, an insulating barrier layer, and a free magnetization layer.

7. A method of manufacturing a semiconductor device, the method comprising:
forming a base layer selected from the group consisting of a back end of line (BEOL) layer a middle of line (MOL) layer and a front end of line (FEOL) layer;
forming a plurality of bottom contacts in the base layer;
forming a first MRAM device that is a cache bit on the base layer in contact with one of the plurality f bottom contacts in a first area; and forming a plurality of second MRAM devices that are storage bit devices on the base layer in contact with one of the plurality of bottom contacts in a second area, the second area surrounding the first area, the plurality of second MRAM devices being formed at a same level as the first MRAM device on the base layer, wherein the first MRAM device has a smaller critical dimension than the plurality of second MRAM devices, wherein the first MRAM device has a lower data retention characteristic and a lower switching current than the plurality of second MRAM devices, and wherein the plurality of second MRAM devices have a lower programming speed and a lower response time than the first MRAM device, and wherein a height of the first MRAM device is higher than a height of the plurality of second MRAM devices.

8. The method of claim 7,
wherein forming the first MRAM device includes forming a first bottom electrode, forming a first MRAM stack on the first bottom electrode, and forming a first top electrode on the first MRAM stack, and wherein forming each of the plurality of second MRAM devices includes forming a second bottom electrode, forming a second MRAM stack on the second bottom electrode, and forming a second top electrode on the second MRAM stack.

9. The method of claim 8, wherein a thickness of the first bottom electrode is different than a thickness of the second bottom electrode.

10. The method of claim 8, wherein a thickness of the first top electrode is different than a thickness of the second top electrode.

11. The method of claim 8,
wherein the first MRAM device includes a spacer layer formed on sidewalls of the first bottom electrode, the first MRAM stack, and the first top electrode, and wherein the plurality of second MRAM devices include a second spacer layer formed on sidewalls of the second bottom electrode, the second MRAM stack, and the second top electrode.

12. The method of claim 7, wherein the first MRAM device and the plurality of second MRAM devices each include a fixed magnetization layer, an insulating barrier layer, and a free magnetization layer.

* * * * *